United States Patent
Nemirovsky et al.

(10) Patent No.: US 6,395,192 B1
(45) Date of Patent: May 28, 2002

(54) METHOD AND APPARATUS FOR REMOVING NATIVE OXIDE LAYERS FROM SILICON WAFERS

(75) Inventors: Yael Nemirovsky; Sara Stolyarova, both of Haifa; Benjamin Brosilow, Afula, all of (IL)

(73) Assignee: Steag C.V.D. Systems Ltd., Migdal Haemek (IL)

( * ) Notice: Subject to any disclaimer, the term of this patent is extended or adjusted under 35 U.S.C. 154(b) by 0 days.

(21) Appl. No.: 09/318,608

(22) Filed: May 26, 1999

Related U.S. Application Data

(60) Provisional application No. 60/086,655, filed on May 26, 1998.

(51) Int. Cl.⁷ .................................................. B44C 1/22
(52) U.S. Cl. ............................ 216/66; 216/72; 216/79; 438/708; 438/738; 438/743
(58) Field of Search ..................... 252/79.1; 438/708, 438/738, 743; 216/63, 64, 66, 79

(56) References Cited

U.S. PATENT DOCUMENTS

| | | | |
|---|---|---|---|
| 4,985,372 A | 1/1991 | Narita ......................... | 437/192 |
| 5,022,961 A | * 6/1991 | Izumi et al. ................. | 156/646 |
| 5,228,206 A | 7/1993 | Grant et al. .................... | 34/1 |
| 5,439,553 A | * 8/1995 | Grant et al. .................. | 216/58 |
| 5,578,133 A | * 11/1996 | Sugino et al. ................. | 134/2 |
| 6,165,273 A | * 12/2000 | Fayfield et al. ............. | 118/722 |

OTHER PUBLICATIONS

K. Torek, PhD Thesis, Penn State University, 1996, Chapter 5.

* cited by examiner

Primary Examiner—Frankie L. Stinson
Assistant Examiner—Allan Olsen
(74) Attorney, Agent, or Firm—Connolly Bove Lodge & Hutz LLP

(57) ABSTRACT

A method and apparatus for selectively removing a native oxide layer from a silicon wafer without significantly affecting the underlying silicon or other materials that may be thereon, by exposing the silicon wafer to an etchant gas including $NF_3$ while simultaneously exposing the wafer to ultraviolet radiation, and heating the wafer to a temperature of 100–400° C.

10 Claims, 2 Drawing Sheets

SELECTIVE NATIVE OXIDE ETCHING FOR SILICON WAFER IN-SITU CLEANING $NF_3/N_2$ + Temperature + UV Activation 3 min treatment

| Sample \ Temper. | a<br>silicon single crystal wafer with native oxide | b<br>4000 A poly-silicon thermal oxide 1000 A $SiO_2$ on silicon wafer | c<br>1000 A thermal oxide on silicon wafer |
|---|---|---|---|
| 27°C/UV | no etching | no etching | no etching |
| 300°C | no etching | no etching | no etching |
| 300°C + UV | native oxide layer completely removed | poly-silicon and thermal oxide layers not etched | no etching |
| 450°C | silicon surface etched | poly-silicon completely removed; thermal oxide remained | no etching |
| 600°C | silicon surface etched | poly-silicon and thermal oxide completely removed | thermal oxide completely removed |

Fig.3.

SELECTIVE NATIVE OXIDE ETCHING FOR SILICON WAFER IN-SITU CLEANING $NF_3/N_2$ + Temperature + UV Activation

3 min treatment

| Sample<br>Temper. | a<br>silicon single crystal wafer with native oxide | b<br>4000 A poly-silicon thermal oxide 1000 A $SiO_2$ on silicon wafer | c<br>1000 A thermal oxide on silicon wafer |
|---|---|---|---|
| 27°C/UV | no etching | no etching | no etching |
| 300°C | no etching | no etching | no etching |
| 300°C + UV | native oxide layer completely removed | poly-silicon and thermal oxide layers not etched | no etching |
| 450°C | silicon surface etched | poly-silicon completely removed; thermal oxide remained | no etching |
| 600°C | silicon surface etched | poly-silicon and thermal oxide completely removed | thermal oxide completely removed |

METHOD AND APPARATUS FOR REMOVING NATIVE OXIDE LAYERS FROM SILICON WAFERS

RELATED APPLICATION

This application is related to Provisional Application No. 60/086,655, filed May 26, 1998 and claims its priority date.

FIELD AND BACKGROUND OF THE INVENTION

The present invention relates to a method and apparatus for selectively removing native oxide layers from silicon wafers without significantly affecting the underlying silicon, or without significantly removing other materials, such as polysilicon or thermal oxide depositions, that may be thereon. Such a process is of substantial importance to the semiconductor industry since the selective removal of native oxide from silicon wafers is among the most frequently performed processes in fabricating silicon semiconductor devices.

Whenever a silicon wafer is exposed to an oxidizing environment, a native oxide layer tends to form on the silicon wafer. Such native oxide layers would deleteriously affect the subsequent processing steps performed on the silicon wafer, and therefore must be cleanly and quickly removed without disturbing other depositions, such as polysilicon or thermal oxide depositions, on the silicon wafer. Generally speaking, a dry cleaning process is more effective and less damaging to the silicon surface than a wet cleaning process.

Narita U.S. Pat. No. 4,985,372 describes a dry cleaning process wherein the silicon wafer surface is exposed to an echant gas including $NF_3$ and $H_2$, or $N_2$ in place of the $H_2$. The process described in that patent requires the generation of a plasma in the chamber at the time the wafer is exposed to the etchant gas.

Another cleaning technique is described in a PhD Thesis by Kevin J. Torek, University of Pennsylvania, May 1996. One described process involves exposing the silicon wafer to $NF_3$ gas and to ultraviolet radiation while at room temperature (20° C.). According to the data set forth in that Thesis (FIG. 8, page 47), the native oxide was etched at a relatively low rate of between 0.7 A/min (at 80 Torr) to 4 A/min (at 760 Torr) The native oxide removal was selective over depositions on the silicon wafer produced by sputtering, chemical vapor deposition, steam-thermal deposition, and dry-thermal oxide deposition.

This Thesis described another process (FIG. 10, page 50) which included heating the wafer while exposing it to $NF_3$ in the presence of ultraviolet light and $H_2O$. However, such a process involves completely different chemistry since the addition of $H_2O$ causes the formation of HF and completely changes the reaction rates and selectivities.

OBJECTS AND BRIEF SUMMARY OF THE INVENTION

An object of the present invention is to provide a method for selectively removing a native oxide layer from a silicon wafer having advantages over the above-described methods known in the prior art. Another object of the invention is to provide apparatus for removing native oxide layers in accordance with the novel method.

According to one aspect of the present invention, there is provided a method of selectively removing a native oxide layer from a silicon wafer without significantly affecting the underlying silicon or other materials that may be there on, comprising exposing the silicon wafer to an etchant gas including $NF_3$ while simultaneously exposing the wafer to ultraviolet radiation and heating the wafer to a temperature of 100–400° C.

Preferably, the process should be performed at a temperature of 250–350° C., particularly good results having been obtained at a temperature of about 300° C. As will be described more particularly below, it has been found that elevating the process temperature as described above substantially increases the removal rate of the native oxide without losing the selectivity achieved at room temperature until the higher end of above-described temperature range is reached At higher temperatures, the native oxide removal rate may increase further, but it was found that selectivity is lost.

According to further features in the preferred embodiment of the invention described below, the etchant gas also includes $N_2$ The example described below includes $N_2$ in approximately equal proportions by volume as the $NF_3$.

According to still further features in the described preferred embodiment, the partial pressure of the etchant gas is preferably within the moderate pressure range, of 10–300 Torr. The higher partial pressures, would be expected to produce faster reaction rates, but would result in a number of disadvantages. Thus, higher pressures in the reactor increase the danger of leakage of $NF_3$ from the reactor to the atmosphere, which can cause a serious health problem since $NF_3$ is highly toxic. In addition, a high pressure in the reactor increases the danger of particles depositing on the silicon wafer being treated which will cause problems in subsequent processing of the wafer. Further, a higher pressure in the reactor increases the wafer processing time in single-wafer processing apparatus, since the $NF_3$ must be completely removed from the chamber prior to transferring the wafer to the next process module. Thus, a low process pressure saves time by requiring less pump down time at the end of the process, and less time for pressure and flow stabilization at the beginning of the process.

Preferably, therefore, the pressure should be below 100 Torr, optimally about 30–60 Torr. In the example described below, the partial pressure of the $NF_3$ was 30 Torr and the partial pressure of the $N_2$ was 30 Torr.

According to another aspect of the present invention, there is provided apparatus for removing a native oxide layer from a silicon wafer without significantly affecting the underlying silicon or other materials that may be there on, comprising a heating chamber including a supporting member for supporting the wafer from which the native oxide layer is to be selectively removed; a heater for heating a wafer on the supportive member to a temperature of 100–400° C.; a gas supply for introducing into the chamber an etchant gas including $NF_3$; and an ultraviolet source for irradiating the wafer with ultraviolet radiation while the wafer is exposed to the etchant gas and is heated to the temperature of 100–400° C.

Further features and advantages of the invention will be apparent from the description below

BRIEF DESCRIPTION OF THE DRAWINGS

The invention is herein described, somewhat diagramatically and by way of example only, with reference to the accompanying drawings, wherein:

FIG. 3 sets forth the results a number of experiments in selectively removing native oxide layers from a silicon wafer in accordance with the present invention.

DESCRIPTION OF A PREFERRED EMBODIMENT

Figure 1:
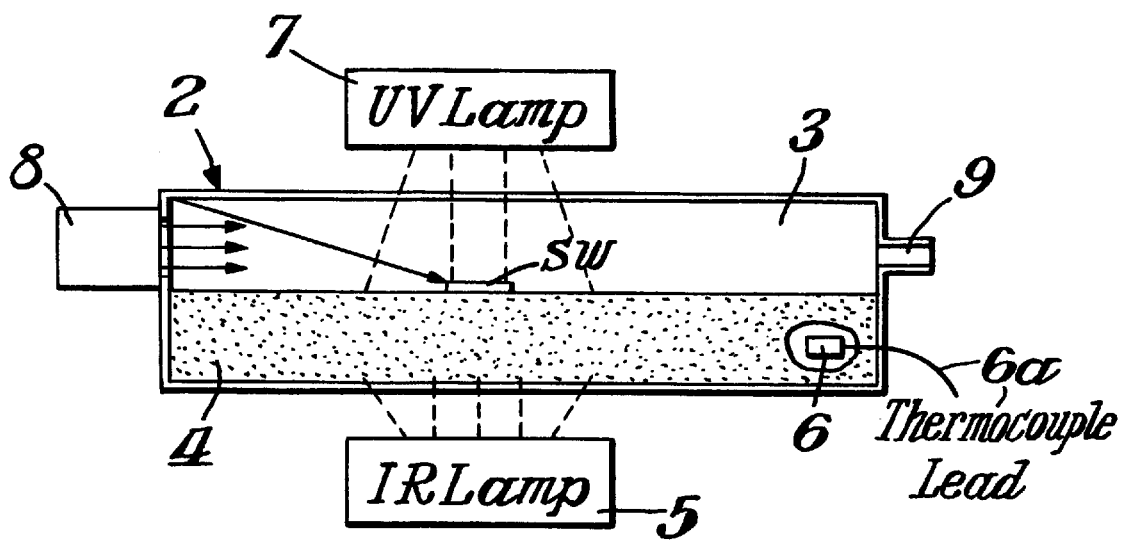
FIG. 1 is a side view illustrating one form of apparatus constructed in accordance with the present invention.
Figure 2:
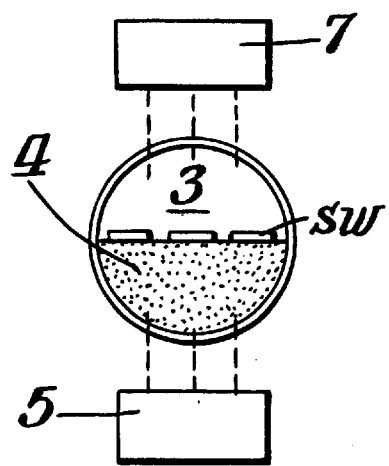
FIG. 2 is an axial view of the apparatus of FIG. 1.

FIGS. 1 and 2 schematically illustrate one form of apparatus constructed in accordance with the present invention for cleaning silicon wafers by selectively removing a native oxide layer from the silicon wafer without significantly affecting the underlying silicon, or a polysilicon or thermal oxide deposition that may be thereon.

The apparatus illustrated in FIGS. 1 and 2 includes a reactor, generally designated 2, consisting of a horizontal quartz tube defining an internal reactor chamber 3. The horizontal quartz tube may be about 85 mm in length, about 15 mm in diameter, and about 2 mm wall thickness. The lower half of reactor chamber 3 is occupied by a half-cylinder shaped graphite susceptor 4 which supports one of more silicon wafers SW to be processed within the reactor chamber. Externally of and below reactor chamber 3 is an infrared lamp 5 which heats the graphite susceptor 4 from below. The graphite susceptor has a thermo-couple 6 embedded within it for temperature measurement, which measurement is outputted via lead 6a. Externally above reactor 2 is a low-pressure mercury lamp 7 which generates ultra-violet light for radiating the silicon wafers SW supported on the graphite susceptor 4. The upstream end of reactor 2 includes a gas supply manifold 8 for supplying the etchant gas; and the down-stream end of the reactor includes a gas discharge assembly 9 for removing the etchant gas Gas discharge assembly 9 may be a roughing pump connected to the downstream end of the reactor chamber by a series of steel pipes.

The reactor 2 is only schematically shown in FIGS. 1 and 2. Preferably it would be of the structure described in U.S. Pat. No. 5,228,206, which description is hereby incorporated by reference.

The silicon wafers SW to be cleaned are supported on the upper flat surface of the graphite susceptor 4, as shown in FIGS. 1 and 2. Preferably, this is done by supporting it on three supporting pins spacing the wafer from the susceptor to minimize the contact of the wafer with the susceptor. The infrared lamp heater 5 is energized to heat the graphite susceptor to a predetermined temperature as measured by thermo-couple 6 embedded within the graphite susceptor. The silicon wafers SW are also irradiated with ultraviolet light from the ultraviolet lamp 7 overlying the reactor 2. While the silicon wafers SW are thus heated by heater 5 and irradiated with ultraviolet light by ultraviolet lamp 7, they are exposed to a flow of etchant gas introduced via the inlet manifold 8 and exhausted via the gas discharge assembly 9.

As one example, the etchant is $NF_3$ mixed with $N_2$. Each gas is supplied at a partial pressure of 30 Torr (total pressure 60 Torr) with a gas flow of 200 cm$^3$/sec. In this example, the process time was three minutes.

A number of silicon wafer samples were thus treated by the etchant while heated by infrared lamps 5, to a predetermined high temperature, ranging from room temperature 27° C. to 600° C., and while exposed to the ultraviolet light from the UV (ultra violet) lamp 7. After the process has been completed, the samples were removed from the reactor chamber and immediately analyzed with an ellipsometer to measure the thickness of the various layers. It was possible to calculate the amount of material removed during each process from each sample by comparing the ellipsometer measurements made with respect to each sample before being processed, with those made after the sample was processed.

FIG. 3 is a table setting forth the results obtained when three silicon wafer samples (a), (b) and (c) were processed as described above at 27° C. (room temperature), 300° C. without ultraviolet radiation, 300° C. with ultraviolet radiation, 450° C. without ultraviolet radiation, and 600° C. without ultraviolet radiation. Sample (a) was a silicon single crystal wafer with a native oxide layer; sample (b) was a silicon wafer having a 4000 A layer of polysilicon and a 1000 A layer of thermal oxide; and sample (c) was a silicon wafer having a 1000 A layer of thermal oxide. The treatment in all cases was carried out for three minutes, and included the etchant gas of $NF_3$ and $N_2$ as described above.

As can be seen from the data set forth in the table of FIG. 3, no significant etching of any of the layers was noted when the process was performed at 27° C. with ultraviolet radiation, or at 300° C. without ultraviolet radiation.

However, when the process was performed at 300° C. with ultraviolet radiation, the native oxide layer was completely removed from sample (a); but neither the polysilicon layer nor the thermal oxide layer was removed from sample (b), nor was the thermal oxide layer removed from sample (c).

When the process was performed at 450° C., even without ultraviolet radiation, the native oxide from sample (a) was completely removed, but the polysilicon from sample (b) was also completely removed. Similarly, when the process was performed at 600° C., the native oxide was removed from sample (a), but the polysilicon and thermal oxide layers were also completely removed from sample (b), and the thermal oxide layer was removed from sample (c). The removal of the polysilicon and thermal oxide layers from samples (b) and (c) would of course destroy the selectivity of the etching process; moreover had the samples also been irradiated with ultraviolet light when heated to these very high temperatures 450° C. and 600° C., it would be expected that the undesired removal of the polysilicon and thermal oxide layers would even have been accelerated.

Accordingly, among the temperatures and other conditions tested in the above-described experiments, it is clear that best results were obtained in rate of removal and selectivity when the process is performed at a temperature approximately 300° C. while accompanied with ultraviolet radiation.

It is believed that the selectivity can be explained by the nature of the reaction involved of the etchant gas with silicon dioxide and silicon. Thus, without ultraviolet radiation, when the temperature is less than 600° C., the process is controlled by the thermally-activated reaction of $NF_3$ with silicon.

$$4NF_3\uparrow + 3Si \rightarrow 3SiF_4\uparrow + 2N_2\uparrow \qquad (1)$$

With UV photon activation, a controlled quantity of F-radicals can be obtained, which interact with $SiO_2$.

$$4F + SiO_2 \rightarrow SiF_4\uparrow + O_2\uparrow \qquad (2)$$

This reaction is less temperature dependent and occurs rather fast (native oxide removed for 3 min) at the temperature lower than those required for the reaction (2).

When the temperature is above 600° C., a thermal decomposition of $NF_3$ to F-radicals takes place. Both reactions therefore occur, and the selectivity is lost.

An important advantage of the process of the present invention is that it achieves a significantly increased etch rate at the low pressure desirable for such process for reasons set forth earlier. For example, at $P_{NF3}$=30 Torr (and $P_{n2}$=30 Torr) the described process at 300° C. gives a native oxide etch rate of over 5 A/min., while the room temperature process reported by Torek (K. Torek, PhD thesis, Penn State University, 1996), referred to above, gave an etch rate of only 0.7 A/min at this NF3 pressure and room temperature. It is to be noted that the higher etch rate given by the elevated temperature process does not harm the selectivity of native oxide etch over thermal oxide and silicon, which are not etched.

While the invention has been described with respect to one preferred embodiment, it will be appreciated that this is set forth merely for purposes of example, and that many other variations, modifications and applications of the invention may be made.

We claim:

1. A method of selectively removing native oxide layer from a silicon wafer, comprising:
   exposing the silicon wafer to an etchant gas including $NF_3$ at a partial pressure of 30–60 Torr while simultaneously exposing the wafer to ultraviolet radiation; and
   heating the wafer to a temperature of 100–400° C.

2. The method according to claim 1, wherein the wafer is heated to a temperature of 250°–350° C.

3. The method according to claim 1, wherein the wafer is heated to a temperature of approximately 300° C.

4. The method according to claim 1, wherein said etchant gas also includes $N_2$.

5. The method according to claim 4, wherein said etchant gas includes $N_2$ in approximately equal proportions by volume with $NF_3$.

6. A method of selectively removing a native oxide layer from a silicon wafer without removing a polysilicon or thermal oxide deposition that may be thereon, comprising:
   exposing the silicon wafer to an etchant gas including $NF_3$ at a partial pressure of 30–60 Torr, while exposing the wafer to ultraviolet radiation, and while heating the wafer to a temperature of 100–400° C.

7. The method according to claim 6, wherein the wafer is heated to a temperature of 250–350° C.

8. The method according to claim 7, wherein the wafer is heated to a temperature of approximately 300° C.

9. The method according to claim 6, wherein said etchant gas also includes $N_2$.

10. The method according to claim 9, wherein said etchant gas includes $N_2$ in approximately equal proportions by volume with $NF_3$.

* * * * *